United States Patent
Zhou

(10) Patent No.: US 7,053,732 B2
(45) Date of Patent: May 30, 2006

(54) MULTI-BIT TIME DELAY ADJUSTER UNIT FOR HIGH RF APPLICATIONS AND METHOD

(75) Inventor: Shu-Ang Zhou, Älvsjö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 42 days.

(21) Appl. No.: 10/493,103

(22) PCT Filed: Sep. 23, 2002

(86) PCT No.: PCT/SE02/01709

§ 371 (c)(1),
(2), (4) Date: Apr. 20, 2004

(87) PCT Pub. No.: WO03/036794

PCT Pub. Date: May 1, 2003

(65) Prior Publication Data
US 2004/0246073 A1    Dec. 9, 2004

(30) Foreign Application Priority Data
Oct. 23, 2001   (SE) .................................. 0103516

(51) Int. Cl.
*H03H 7/30*   (2006.01)
(52) U.S. Cl. .......................... 333/156; 333/18; 333/164
(58) Field of Classification Search ........ 333/138–140, 333/156, 164, 18, 28 R; 342/375
See application file for complete search history.

(56) References Cited

U.S. PATENT DOCUMENTS

| | | | | |
|---|---|---|---|---|
| 3,295,138 A | * | 12/1966 | Nelson ....................... | 342/375 |
| 3,781,722 A | * | 12/1973 | Pierson ....................... | 333/156 |
| 4,341,999 A | * | 7/1982 | Rudish et al. .............. | 327/236 |
| 5,828,699 A | * | 10/1998 | Heinemann ................. | 375/230 |
| 6,191,735 B1 | * | 2/2001 | Schineller ................... | 342/375 |
| 6,281,838 B1 | * | 8/2001 | Hong ......................... | 342/371 |
| 6,587,017 B1 | * | 7/2003 | Sheng et al. ................ | 333/139 |
| 6,741,207 B1 | * | 5/2004 | Allison et al. .............. | 342/371 |
| 6,829,471 B1 | * | 12/2004 | White et al. ............. | 455/194.2 |

FOREIGN PATENT DOCUMENTS

| | | |
|---|---|---|
| JP | 60-223316 | 11/1985 |
| JP | 61-093711 | 5/1986 |
| SU | 1638790 | 3/1991 |

OTHER PUBLICATIONS

International Preliminary Examination Report completed Sep. 9, 2003 in corresponding PCT Application PCT/SE02/01709.

* cited by examiner

Primary Examiner—Seungsook Ham
(74) Attorney, Agent, or Firm—Nixon & Vanderhye P.C.

(57) ABSTRACT

A multi-bit time-delay adjuster with Radio Frequency (RF) MicroElectroMechanical (MEM) switches may be used in MultiCarrier Power Amplifiers (MCPAs) with a feed-forward linearization technique. The multi-bit time-delay adjuster makes it possible to automatically control a time-delay match with very high precision typically required in feed-forward MCPAs. A searching process for the automatic control of time-delay match is also introduced.

20 Claims, 7 Drawing Sheets

MULTI-BIT TIME DELAY ADJUSTER UNIT FOR HIGH RF APPLICATIONS AND METHOD

This application is the US national phase of international application PCT/SE02/01709, filed in English on 23 Sep. 2001, which designated the US. PCT/SE02/01709 claims priority to SE Application No. 0103516-1 filed 23 Oct. 2001. The entire contents of these applications are incorporated herein by reference.

FIELD OF INVENTION

The present invention relates to a method for adjusting a time-delay using a multi-bit time-delay adjuster unit and a multi-bit time-delay adjuster unit. The method and the time-delay adjuster unit are specially suitable for high precision time-delay matches required in e.g. a Multi-Carrier Power Amplifier (MCPA).

BACKGROUND

Highly linear and efficient RF power amplifiers are critical components in modern radio communications systems. Feed-forward linearization is a known linearization technique, which is especially used in MCPAs in order to fulfill extremely high linearity requirements, e.g. for third generation (3G) radio communication systems using high RF frequencies in the order of GHz. It is difficult to implement a cost-effective and time-efficient feed-forward linearization technique due to stringent requirements for accurate matching of the time-delay loops in the MCPAs. Because of common deviations of RF components fabricated in standard processes, the accurate time-delay match in the MCPAs with feed-forward linearization implementation is today made manually by, e.g., cutting or soldering the length of delay-line cables or microstriplines, which is a time-consuming and costly process. Such a manual testing process may often lead to lower linearity performance of the MCPAs due to limited manual capability of making an extremely fine-tuned match, especially in mass production. Besides, when the MCPAs in fields are deployed with radio base stations, they have to be regularly tested and possibly re-configured in order to compensate for variations in the characteristics of the MCPAs due to component aging as well as environmental effects. This is a difficult task for mobile telephone operators who may have no specially trained technicians.

In spite of introducing tunable delay lines for feed-forward power amplifiers, and thus obtaining the possibility to implement an automatic time-delay adjusting method, there are practical difficulties due to, e.g., the extremely high linearity requirements for the feed-forward MCPAs. That prevents the use of existing semiconductor tunable components.

Using delay filters to replace conventional transmission delay lines, such as coaxial cables, have also been proposed, which may provide size, integration, and possible cost advantages. There are, however, some practical problems with regard to, e.g., the bandwidth limitation of the delay filter. The intrinsic linearity characteristic and the time-delay tunability of the delay filter in a relatively wide tuning range required by the feed-forward MCPAs are examples of such problems.

The U.S. Pat. No. 6,281,838 discloses a phased array antenna system that employs Single-Pole Single Through (SPST) RF MEM switches and transmission lines to provide true time-delays in order to steer the antenna beam. However, the antenna system described in U.S. Pat. No. 6,281,838 does not provide an automatic time-delay adjustment and, in particular, not in connection with a MCPA.

The U.S. Pat. No. 5,828,699 discloses an adaptive time-delay adjuster. The time-delay elements are always connected to the transmission line path (see FIG. 1) even when the time-delay elements are switched off. That affects the local impedance and RF characteristics of the entire delay line, which results in local impedance mismatching and reflection, and certain filter functions block certain bands of signals passing through the delay line. Thus, the time-delay adjuster disclosed in U.S. Pat. No. 5,828,699 is not adapted for high RF frequencies.

An object of the present invention is to achieve automatic time-delay adjustment with a high precision, for use in high frequency applications.

SUMMARY

The above-mentioned and other objects are achieved by the present invention. Advantages of the present invention include (1) extremely high precision of the time delay adjuster can be achieved in a short time; (2) remote control/adjustment of feedforward MCPAs that is particularly useful for mobile telecom operators; (3) facilitated mass production of feedforward MCPAs with low cost and high performance by avoiding both time and labor cost consuming manual trimming processes; and (4) in an example embodiment using RF MEM switches, the time-delay adjuster unit obtains desired properties required by the feedforward MCPAs, such as high linearity, low insertion loss, and capability for broadband operations.

b shows a two-bit time-delay adjuster as an illustrative example of prior art.

Figure 2:
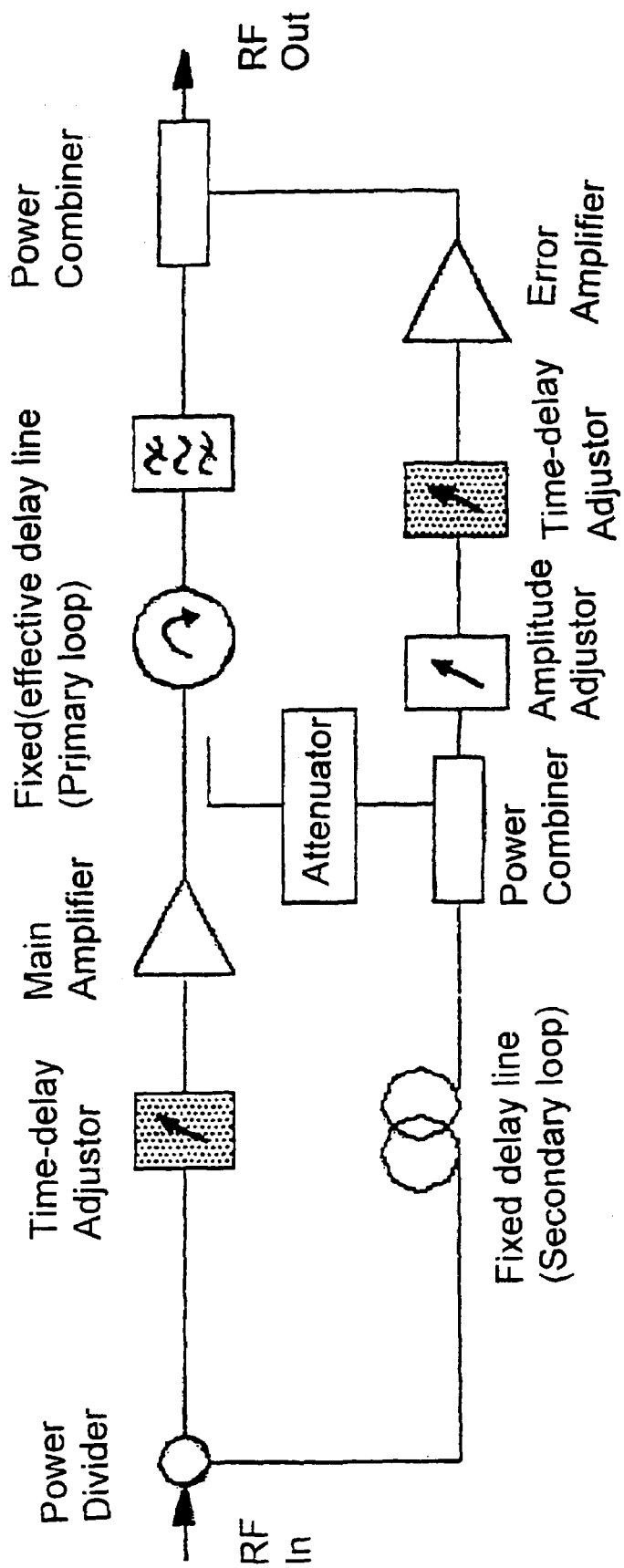

FIG. 2 shows a typical feed-forward final-stage power amplifier block diagram according to prior art.

Figure 3:
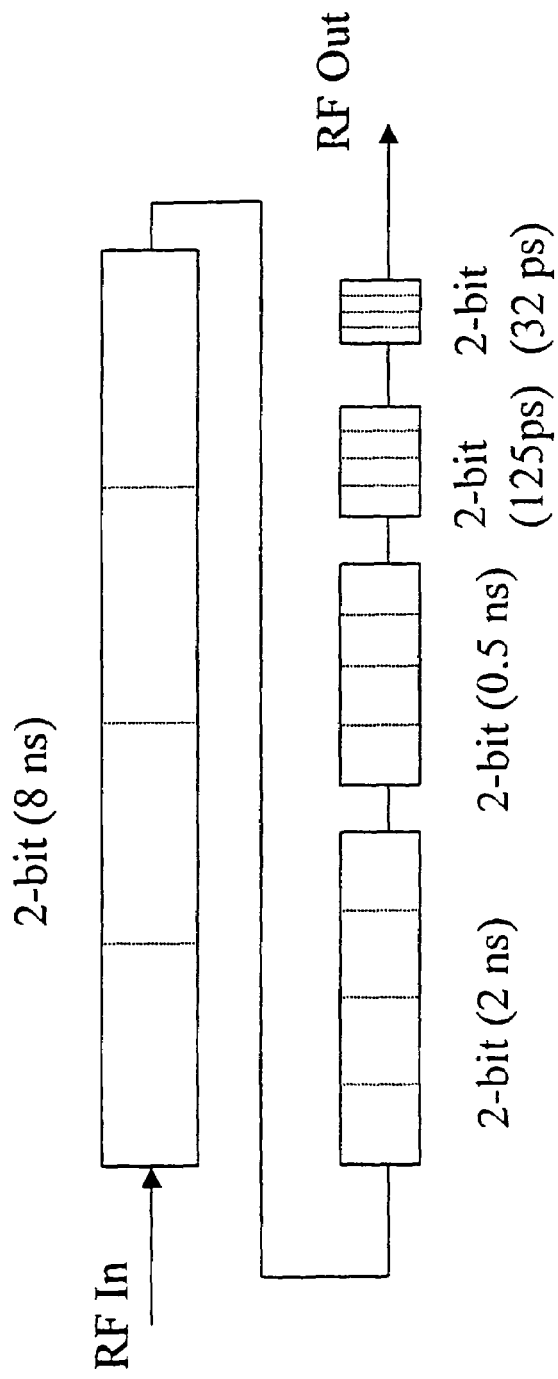

FIG. 3 shows a five two-bit time-delay adjuster unit according to the present invention.

Figure 4:
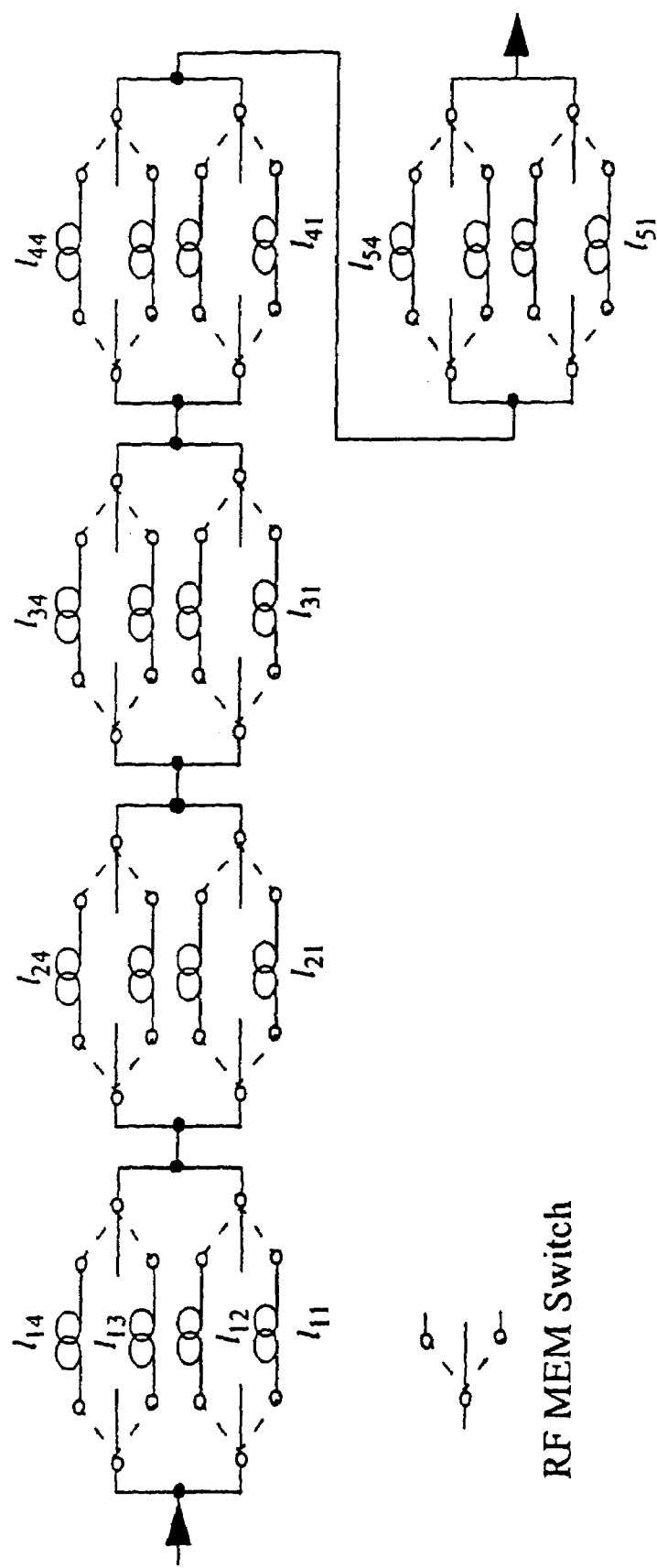

FIG. 4 discloses a four-bit time-delay adjuster unit according to a first preferred embodiment the present invention.

Figure 5:
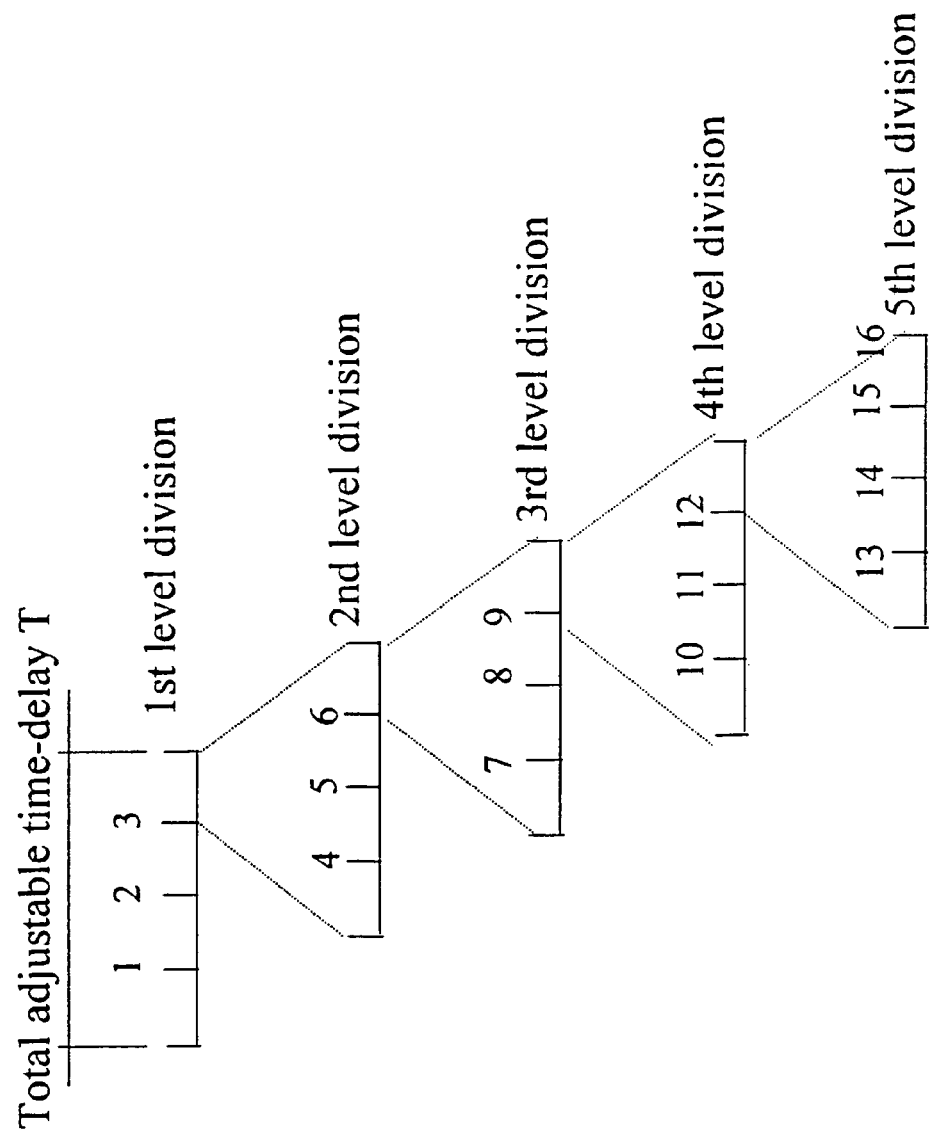

FIG. 5 shows a scheme of the division of the total adjustable time-delay implemented in a multi-bit time-delay adjuster unit according to the present invention.

Figure 6:
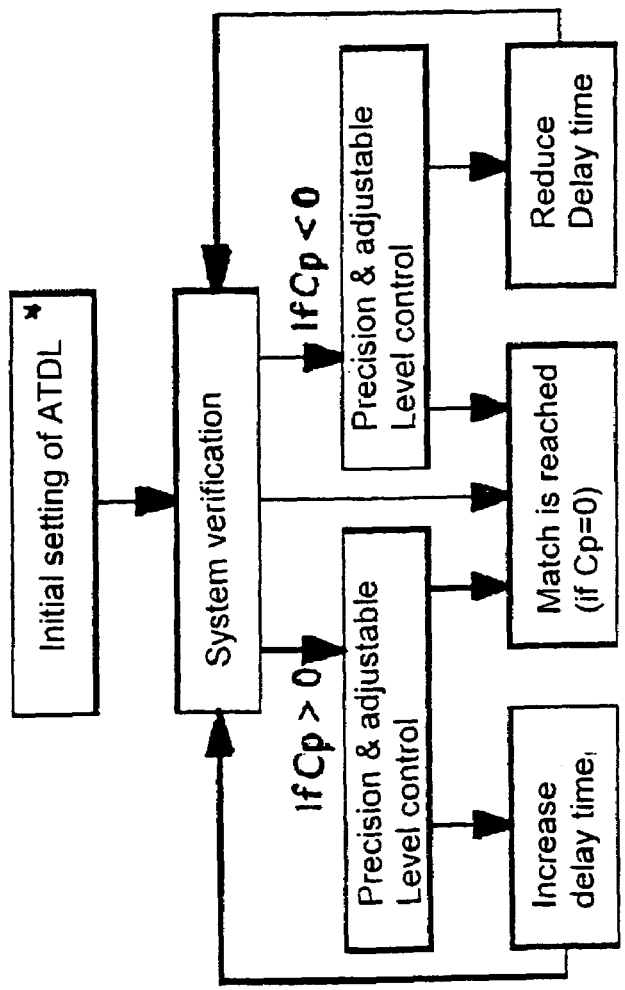

FIG. 6 shows a flowchart describing the auto-search method according to the present invention.

Figure 7:
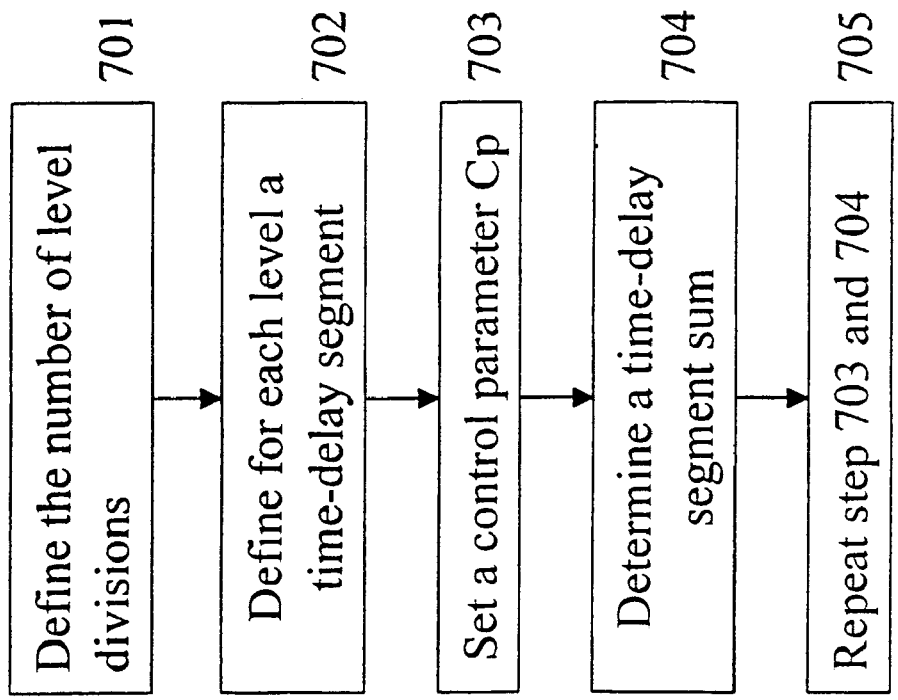

FIG. 7 shows a flowchart describing an auto-search method in a general mode according to the present invention.

DETAILED DESCRIPTION

A method for adjusting a time-delay using a multi-bit time-delay adjuster unit for automatic tuning of any specific time-delay within a tunable time-delay interval specified for the time-delay adjuster unit will be described below in the detailed description of the present invention. This tuning is, e.g., required in an MCPA with a feed-forward linearization technique.

A multi-bit time-delay adjuster unit for automatic adjusting a time-delay with a high precision is also disclosed. The adjuster unit described in the examples below, comprises MicroElectroMechanical (MEM) switches and in particular, RF MEM Single-Pole Double Through (SPDT) switches. The invention is not limited to the use of RF MEM switches, it is also possible to use other types of switches. However, RF MEM SPDT switches are specially designed for digital tuning of time-delay matching required in e.g. feed-forward loops in MCPAs. RF MEM switches may also be used because the RF MEM switches have superior linearity performance, broadband frequency response, and much lower insertion loss than their semiconductor counterparts. These features are known important in feed-forward MCPAs.

Figure 1B:
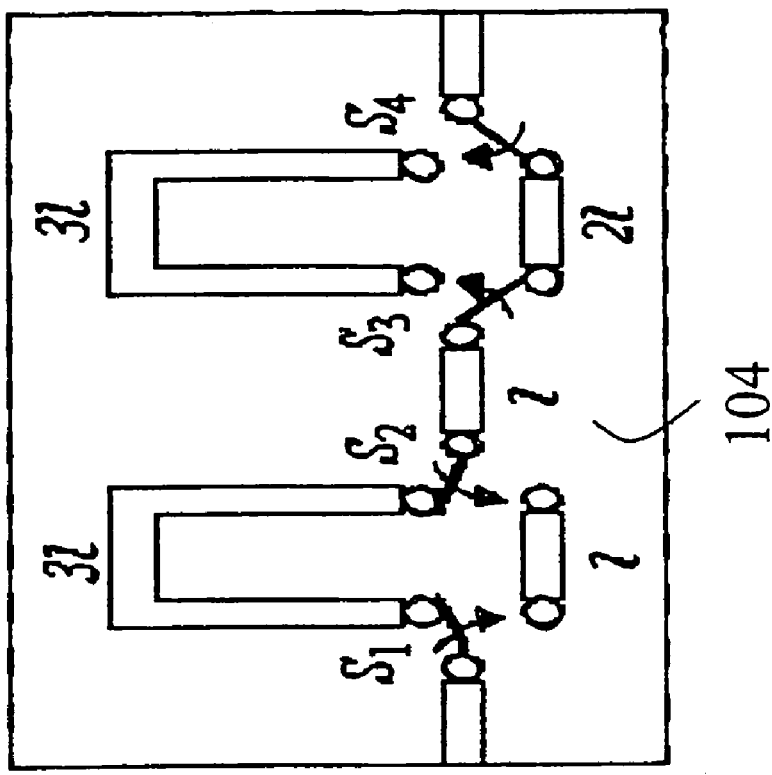
FIG. 1a shows a one-bit time-delay adjuster as an illustrative example of prior art.
Figure 1A:
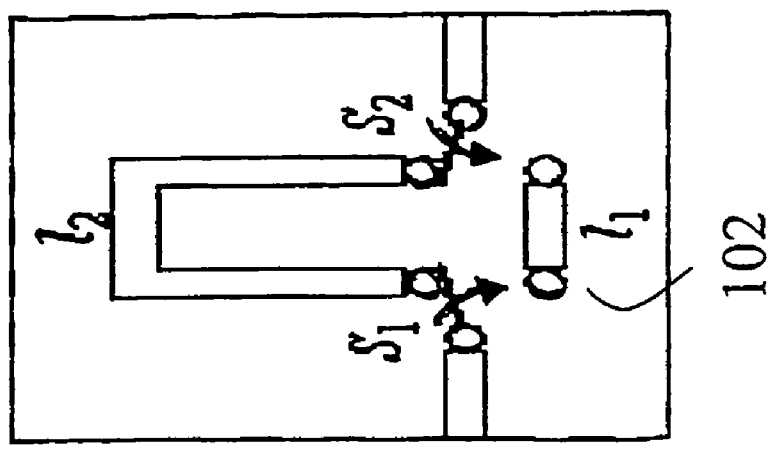

Both FIG. 1a and FIG. 1b show illustrative examples of time-delay adjusters according to the prior art. FIG. 1a, shows a one-bit time-delay adjuster and FIG. 1b shows a two-bit time-delay adjuster. $S_i$ (i=1, 2, 3, 4) denotes the MEM switches, and $l$, $l_1$, $l_2$ denote the lengths of the delay line elements, which e.g. may be microstriplines. It is shown that the one-bit time-delay adjuster may have two different time-delay states, and the two-bit time-delay adjuster may have four different time-delay states. In accordance with FIGS. 1a and 1b, the delay line elements are disconnected when they are switched off. In general, an n-bit time-delay adjuster has $2^n$ different time-delay states.

A multi-bit time-delay adjuster unit, using RF MEM SPDT switches specially designed for time-delay adjustment in high RF frequency applications, e.g., a feed-forward loop in a MCPA, is now described. A typical scheme of a feed-forward final stage MCPA is shown in FIG. 2. The multi-bit time-delay adjuster units may replace the two time-delay adjustor units. Provided that both the time-delay adjusters shown in FIG. 2 are low RF power devices, it is possible to use RF MEM switches that currently have limited power handling capability (i.e. less than a few Watts).

A multi-bit time-delay adjuster, comprising a total digitally tunable delay time interval T, that is divided according to the present invention, provides a high precision time-delay adjuster unit, that comprises a relative few number of bits (in the preferred embodiment four bits). A high-bit e.g. ten-bit time-delay adjuster may be produced in practice, but its RF performance will be generally worse than its lower-bit counterpart. In addition, the size and cost of said high-bit time-delay adjuster would be tremendously high. The number of bits is referred to in the meaning of the number of switching states. I.e. an m bit adjuster has $2^m$ different switching states. The four-bit time-delay adjuster according to the preferred embodiment is implemented with RF MEM SPDT switches, instead of the Single-Pole Single Through (SPST) switches used in U.S. Pat. No. 6,281,838 The RF MEM SPDT switches shown in a first preferred embodiment of the present invention in FIG. 4 have the advantage of less stiction problems than RF MEM SPST switches that may cause failure of the adjustable delay-lines due to the use of bi-directional force actuation. In addition, the SPDT switches shown in FIG. 4 reduce the number of switch elements used in the adjustable delay line.

FIG. 4 shows further a five level division of the four-bit time-delay adjuster unit, in which the time-delay elements can be defined as follows. Suppose that the specified total time delay is T. A zero time-delay of the adjuster is defined as the case when $l_{11}$, $l_{21}$, $l_{31}$, $l_{41}$, and $l_{51}$ are connected, i.e. switched on. The time-delay elements are always disconnected when they are switched off. That implies that the present invention is suitable for high RF frequency applications in accordance with the discussion above In the background section. In this embodiment, two RF MEM switches, (e.g. the switch with the delay element $l_{14}$ and $l_{13}$ is connected in parallel with the switch with the delay element $l_{12}$ and $l_{11}$), are connected in parallel and each set of parallel RF MEM switches are then connected in serial. The individual time-delay elements in FIG. 4 are defined by the example below according to the division disclosed in the present invention, which is suitable for fine tuning match used in e.g. feedforward MCPAs.

At a first level division:

$l_{12}$ is made in such a way that a time-delay of T/4 is obtained when $l_{12}$, $l_{21}$, $l_{31}$, $l_{41}$, and $l_{51}$ are connected.

$l_{13}$ is made in such a way that a time-delay of 2T/4 is obtained when $l_{13}$, $l_{12}$, $l_{21}$, $l_{41}$, and $l_{51}$ are connected.

$l_{14}$ is made in such a way that a time-delay of 3T/4 is obtained when $l_{14}$, $l_{21}$, $l_{31}$, $l_{41}$, and $l_{51}$ are connected.

At a second level division:

$l_{22}$ is made in such a way that a time-delay of $T/4^2$ is obtained when $l_{11}$, $l_{22}$, $l_{31}$, $l_{41}$, and $l_{51}$ are connected.

$l_{23}$ is made in such a way that a time-delay of $2T/4^2$ is obtained when $l_{11}$, $l_{23}$, $l_{31}$, $l_{41}$, and $l_{51}$ are connected.

$l_{24}$ is made in such a way that a time-delay of $3T/4^2$ is obtained when $l_{11}$, $l_{24}$, $l_{31}$, $l_{41}$, and $l_{51}$ are connected.

At the third level division:

$l_{32}$ is made in such a way that a time-delay of $T/4^3$ is obtained when $l_{11}$, $l_{21}$, $l_{32}$, $l_{41}$, and $l_{51}$ are connected.

$l_{33}$ is made in such a way that a time-delay of $2T/4^3$ is obtained when $l_{11}$, $l_{21}$, $l_{33}$, $l_{41}$, and $l_{51}$ are connected.

$l_{34}$ is made in such a way that a time-delay of $3T/4^3$ is obtained when $l_{11}$, $l_{21}$, $l_{34}$, $l_{41}$, and $l_{51}$ are connected.

At the fourth level division:

$l_{42}$ is made in such a way that a time-delay of $T/4^4$ is obtained when $l_{11}$, $l_{21}$, $l_{31}$, $l_{42}$, and $l_{51}$ are connected.

$l_{43}$ is made in such a way that a time-delay of $2T/4^4$ is obtained when $l_{11}$, $l_{21}$, $l_{31}$, $l_{43}$, and $l_{51}$ are connected.

$l_{44}$ is made in such a way that one gets a time-delay of $3T/4^4$ when $l_{11}$, $l_{21}$, $l_{31}$, $l_{44}$, and $l_{51}$ are connected.

At the fifth level division:

$l_{52}$ is made in such a way that a time-delay of $T/4^5$ is obtained when $l_{11}$, $l_{21}$, $l_{31}$, $l_{41}$, and $l_{52}$ are connected.

$l_{53}$ is made in such a way that a time-delay of $2T/4^5$ is obtained when $l_{11}$, $l_{21}$, $l_{31}$, $l_{41}$, and $l_{53}$ are connected.

$l_{54}$ is made in such a way that a time-delay of $3T/4^5$ is obtained when $l_{11}$, $l_{21}$, $l_{31}$, $l_{41}$, and $l_{54}$ are connected.

By such a way of division, the longest time-delay is the case when $l_{14}$, $l_{24}$, $l_{34}$, $l_{44}$, and $l_{54}$ are connected, which corresponds to a total time-delay of $T-T/4^5$. $T/4^5$ is the finest precision (if T=10 ns, $T/4^5$=9.76 ps) achievable by the time-delay adjuster for the adjustable time-delay range of 0 to 10 ns according to the design given above.

In FIG. 5, it is disclosed how the tunable time-delay interval [0,T] is divided up to the fifth level division. The method used for the division is illustrated in the example below.

1. The time-delay interval [0,T] is specified.
2. The first level division: The time-delay T is divided into four equal segments. It may also be divided into another number of equal segments, however four is preferred since it makes it possible to use a combination of standard two-bit time-delay adjusters and/or to use a specific type of RF MEM switches as shown in FIG. 4. Here, in the case of four equal segments, each segment has a time-delay of T/4 (if T=10 ns, T/4=2.5 ns for each time-delay segment).

3. The second level division: The last segment, (it is naturally possible to use any other segment) of the first level division is further divided into four smaller equal time-delay segments. I.e., each segment has a time-delay of (T/4)/4 (if T=10 ns, (T/4)/4=0.625 ns).

4. The third level division: The last segment of the second level division is further divided into four smaller equal time-delay segments. I.e., each segment has a time-delay of (T/16)/4 (if T=10 ns, (T/16)/4=0.15625 ns).

5. The fourth level division: The last segment of the third level division is then further divided into four smaller equal time-delay segments. I.e., each segment has a time-delay of (T/64)/4 (if T=10 ns, (T/64)/4=0.039 ns).

6. The fifth level division: The last segment of the fourth level division is further divided into 4 smaller equal time-delay segments, i.e., each segment has a time-delay of (T/256)/4 (if T=10 ns, (T/256)/4=0.00976 ns). It is here shown that 9.76 ps precision of time-delay adjustment can be achieved by a four-bit time-delay adjuster with sixteen different time-delay states.

If a 5-bit time-delay adjuster with 32 different time-delay states designed according to the method above is used, a precision of 9.2 fs may be achieved at fine-tuning of the time-delay. Assuming that the signal propagation speed in the delay line is $v_s=10^8$ m/s, the 9.2 fs time-delay would correspond to a length of the delay line segment of about 0.92 µm, which is hardly achievable by manual adjustment by, e.g., cutting or soldering the delay line.

The number of the required divisions depends on the total maximum time-delay required and the time-delay precision specified in practical applications.

The time delay adjuster unit comprises segments of transmission lines of different lengths connected by MEM switches. In general, there are a number of ways of physically constructing time delay adjusters. E.g., besides the mentioned integrated multi-bit time-delay adjuster unit, it is also possible to use a combination of low-bit time-delay adjusters. An example of such a combination of five two-bit time-delay adjusters, which can either be in a properly packaged form, or fabricated on an integrated circuit, is shown in FIG. 3. The time-delay adjuster unit may use the search algorithm, introduced below, where it can reach the time-delay match within a precision of 8 ps by means of a 10 ns tunable time-delay interval T disclosed in FIG. 5.

All switches in the time-delay adjusters are controlled by electronic circuits, which are programmable by means of computer program product. The computer program product comprises the software code means for performing the steps of the method described above. The computer program product is run on processing means in a computer or in another logic control unit. The computer program is loaded directly or from a computer usable medium, such as a floppy disc, a CD, the Internet etc.

Automatic Time-Delay Search Method

In order to use the above-disclosed multi-bit time-delay adjuster unit for e.g. feed-forward MCPAs, an automatic search method for the best time-delay match is disclosed below in accordance with the present invention. The search method is described by the example below and is illustrated in a flowchart in FIG. 6.

A Control parameter Cp is introduced as a measure of a relation between a present time-delay and a desired time-delay. The Cp is set according to the performance, e.g. linearization requirement, of the MCPA during a test of the time-delay adjustment.

The control parameter Cp may take the following exemplary values:

$C_p>0$, e.g. Cp=1: The time-delay of the time-delay adjuster should be increased.

$C_p<0$, e.g. Cp=-1: The time-delay of the time-delay adjuster should be decreased.

$C_p=0$: Match is reached.

In practice, the perfect match is seldom reached. Instead, the match is considered to be reached (Cp=0) if the time-delay of the adjuster unit is within a specified precision range Tp. The precision range Tp is determined by the time-delay adjuster unit. E.g., for the four-bit time-delay adjuster designed above with a time-delay interval of 10 ns, the precision range Tp is 9.76 ps, which is the smallest time-delay segment available in the above mentioned four-bit time-delay adjuster, while for the five-bit time-delay adjuster, Tp is 9.2 fs.

Considering now an example of the above mentioned four-bit time-delay adjuster unit having the 10 ns tuning range (i.e. the total time-delay interval T). Suppose that the desired time-delay match will be achieved at 6.35 ns. The following time-delay segments for the four-bit time-delay adjuster at five level divisions are introduced:

ΔT(1)=2.5 ns denotes the first level time-delay segment.

ΔT(2)=0.625 ns denotes the second level time-delay segment.

ΔT(3)=0.156 ns denotes the third level time-delay segment.

ΔT(4)=0.039 ns denotes the fourth level time-delay segment.

ΔT(5)=0.00976 ns denotes the fifth level time-delay segment.

$\Delta T(k)=T/n^k$ T is here 10 ns, n=4 and k is an integer number from 1 to p and here is p=5.

The number of level divisions, referred to as p, is set by the time-delay adjuster (hardware) used in the system. The proper choice of the time delay adjuster depends e.g. on the specification of the MCPAs.

An auto-search process starts, when the initial settings of the adjustable time-delay line are performed:

1. First, set the time-delay of the time-delay adjuster to:
   $T_d(1)=\Delta T(1)=2.5$ ns;
   System performance test sets $C_p(1)>0$ (since $T_d(1)=2.5$ ns<6.35 ns, the desired value);

2. Since $C_p(1)>0$, set $T_d(2)=T_d(1)+\Delta T(1)=5$ ns;
   System performance test sets Cp(2)>0 (since the time-delay segment sum Td(2)=5 ns<6.35 ns);

3. Since $C_p(2)>0$, set $T_d(3)=T_d(2)+\Delta T(1)=7.5$ ns;
   System performance test sets now $C_p(3)<0$ (since $T_d(3)=7.5$ ns>6.35 ns);

4. Since $C_p(3)<0$, while $C_p(2)>0$, we set $T_d(4)=T_d(2)+\Delta T(2)=5.625$ ns ($T_d(3)$ and $\Delta T(1)$ are too long, therefore $T_d(2)$ and $\Delta T(2)$ are used.)
   System performance test will now set $C_p(4)>0$ (since $T_d(4)=5.625$ ns<6.35 ns);

5. Since $C_p(4)>0$, while $C_p(3)<0$, we set $T_d(5)=T_d(4)+\Delta T(2)=6.25$ ns;

System performance test will now set $C_p(5)>0$ (since $T_d(5)=6.25$ ns<6.35 ns);
6. Since $C_p(5)>0$, and $C_p(4)>0$, we set $T_d(6)=T_d(5)+\Delta T(2)=6.875$ ns;
   System performance test will now set $C_p(6)<0$ (since $T_d(6)=6.875$ ns>6.35 ns);
7. Since $C_p(6)<0$, while $C_p(5)>0$, we set $T_d(7)=T_d(5)+\Delta T(3)=6.406$ ns;
   System performance test will now set $Cp(7)<0$ (since $Td(7)=6.406$ ns>6.35 ns);
8. Since $C_p(7)<0$, while $C_p(6)<0$, we set $T_d(8)=T_d(5)+\Delta T(4)=6.289$ ns;
   System performance test will now set $C_p(8)>0$ (since $T_d(8)=6.289$ ns<6.35 ns);
9. Since $C_p(8)>0$, and $C_p(7)>0$, we set $T_d(9)=T_d(8)+\Delta T(4)=6.328$ ns;
   System performance test will now set $C_p(9)>0$ (since $T_d(9)=6.328$ ns<6.35 ns);
10. Since $C_p(9)>0$, and $C_p(8)>0$, we set $T_d(10)=T_d(9)+\Delta T(4)=6.367$ ns;
    System performance test will now set $C_p(10)<0$ (since $Td(10)=6.367$ ns>6.35 ns);
11. Since $C_p(10)<0$, while $C_p(9)>0$, we set $T_d(11)=T_d(9)+\Delta T(5)=6.33776$ ns;
    System performance test will now set $C_p(11)>0$ (since $T_d(11)=6.33776$ ns<6.35 ns);
12. Since $C_p(11)>0$, while $C_p(10)<0$, we set $T_d(12)=T_d(11)+\Delta T(5)=6.34752$ ns;
    Since $|T_d(12)-6.35|=0.00248$ ns, which is within the precision range of 0.00976 ns set by the multi-bit time-delay adjuster shown in FIG. 4, the search process is stopped i.e., by setting $Cp(12)=0$.

This example shows that after only 12 search steps, the time-delay match within the precision range of 9.76 ps can be reached. The precision is hence limited by the four-bit time-delay adjuster unit. The demonstrated searching process may be generalized to other multi-bit time-delay adjusters and can be programmed as an automatic search algorithm for specific system applications when the RF MEM switches inside the multi-bit time-delay adjuster is electronically controlled by digital circuits.

FIG. 7 shows a flowchart of a method according to the present invention. The method is performed by means of a multi-bit time-delay adjuster and is intended for automatic control of the time-delay match e.g. required in feedforward MCPAs. The method comprises the following steps:

701. The total number of level divisions p is defined.
702. A time-delay segment $\Delta T(k)$ is defined for each level k, where k is an integer number from 1 to p.
703. A Control parameter Cp is set where Cp is a measure of the relation between a present time-delay and a desired time-delay.
704. A time-delay segment sum is determined by addition of time-delay segments $\Delta T(k)$.
705. Steps 703 and 704 are repeated until the desired time-delay is reached or the sum is within an allowed precision range Tp and Cp is given a predetermined value, e.g. Cp=0.

Generally, the above-described method according to the present invention may be used not only for feed-forward MCPAs, but also for other applications, where precise control of the phase or the time-delay of signals is required, such as adaptive antennas.

The method is implemented by means of a computer program product comprising the software code means for performing the steps of the method. The computer program product is run on processing means in a computer or in any other logical control unit. The computer program is loaded directly or from a computer usable medium, such as a floppy disc, a CD, the Internet etc.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A method for adjusting a time-delay for a high radio frequency (RF) application on the order of around 1 GHz or more using a multi-bit time-delay adjuster unit, wherein the unit has a tunable time-delay within a specified time-delay interval [0,T], and is adapted to reach a desired time-delay, the method comprising:
   defining a total number of level divisions p,
   defining for each level division a time-delay segment $\Delta T(k)$, where k is an integer number from 1 to p,
   setting a control parameter Cp, where Cp is a measure of a relation between a present time-delay and the desired time-delay,
   determining a time-delay segment sum by adding time-delay segments $\Delta T(k)$, and
   repeating the setting step and the determining step until the desired time-delay is reached or the sum is within an allowed precision range Tp, and Cp is then given a predetermined value.

2. The method according to claim 1, wherein the value of Cp depends on whether the desired time-delay is greater than, smaller than, or equal to the present time-delay.

3. The method according to claim 1, wherein the setting-step further comprises:
   controlling whether the sum is to be increased or decreased.

4. The method according to claim 1, wherein the time-delay segments $\Delta T(k)$ are defined by the following steps:
   specifying the tunable time-delay interval [0,T],
   determining the number of level divisions p, and
   repeatedly performing p level divisions,
   wherein (p>1) and a time-delay segment $\Delta T(k)$ is further divided into n equal time-delay segments $\Delta T(k+1)$ on a lower level.

5. The method according to claim 1, wherein the adjuster unit includes RF MicroElectroMechanical (MEM) switches.

6. The method according to claim 1, wherein the adjuster unit includes Single-Pole Double Through (SPDT) RF MicroElectroMechanical (MEM) switches.

7. The method according to claim 1, wherein a size of each time-delay segment $\Delta T(k)$ is $T/n^k$, where k is an integer number from 1 to p, T denotes a length of the specified time-delay interval, and n denotes a number of time-delay segments in the time-delay interval T.

8. The method according to claim 1, wherein a total number of level divisions depends on a number of available states of the time-delay adjuster unit.

9. The method according to claim 7, wherein n equals four.

10. The method according to claim 1, wherein the adjustable time-delay is adjusted for a MultiCarrier Power Amplifier (MCPA) with a feed-forward linearization technique.

11. A computer program product stored on a computer-usable medium, comprising a computer-readable program for causing a processor to control the execution of the steps in claim 1.

12. A computer program product directly loadable into a computer usable medium, comprising the software code portions executable by a computer for performing the steps of claim 1.

13. A multi-bit time-delay adjuster unit for high RF frequency applications adapted to tune a time-delay within a specified time-delay interval [0,T], wherein the unit comprises:
switches, and
a level divider adapted to repeatedly perform p level divisions (p>1) in order to provide time-delay segments ΔT(k) according to the method defined by claim 1.

14. The multi-bit time-delay adjuster according to claim 13, wherein the switches are Radio Frequency (RF) Micro-ElectroMechanical (MEM) switches.

15. The multi-bit time-delay adjuster according to claim 14, wherein the RF MEM switches are Single-Pole Double Through (SPDT) RF MEM switches.

16. The multi-bit time-delay adjuster unit according to claim 13, wherein a size of each time-delay segment ΔT(k) is $T/n^k$, where T denotes the specified time-delay interval, n denotes a number of segments in that the time-delay interval T, k is an integer number from 1 to p, and p is a total number of level divisions.

17. The multi-bit time-delay adjuster unit according to claim 13, wherein a total number of level divisions depends on a of the number of available states of the time-delay adjuster unit.

18. The multi-bit time-delay adjuster unit according to claim 16, wherein n equals four.

19. The multi-bit time-delay adjuster unit according to claim 13, wherein the time-delay is adjusted for a Multi-Carrier Power Amplifier (MCPA) with a feed-forward linearization technique.

20. The method in claim 1, wherein one or more of the time delay segments are disconnected from the adjuster unit when not needed for the desired time-delay.

* * * * *